United States Patent
Schram

(10) Patent No.: US 9,885,761 B2
(45) Date of Patent: Feb. 6, 2018

(54) DC POWER HEATER SHORT-TO-CHASSIS GROUND DETECTION CIRCUIT

(71) Applicant: Rosemount Aerospace, Inc., Burnsville, MN (US)

(72) Inventor: Kenneth J. Schram, Eden Prairie, MN (US)

(73) Assignee: ROSEMOUNT AEROSPACE, INC., Burnsville, MN (US)

( * ) Notice: Subject to any disclaimer, the term of this patent is extended or adjusted under 35 U.S.C. 154(b) by 135 days.

(21) Appl. No.: 15/069,713

(22) Filed: Mar. 14, 2016

(65) Prior Publication Data

US 2017/0261563 A1    Sep. 14, 2017

(51) Int. Cl.
| | |
|---|---|
| G01R 31/00 | (2006.01) |
| G01R 31/40 | (2014.01) |
| H02H 3/32 | (2006.01) |
| H02H 3/16 | (2006.01) |

(52) U.S. Cl.
CPC ............... *G01R 31/40* (2013.01); *H02H 3/32* (2013.01); *H02H 3/16* (2013.01)

(58) Field of Classification Search
CPC  A61B 2018/00827; A61B 2018/00791; A61B 18/14; A61B 2017/00084; A61B 2018/00767; A61B 2018/00708; A61B 2018/0072; A61B 5/0002; H01L 41/042; G01K 7/13; G01R 19/0092; G01R 21/133; G01R 15/207; G01R 31/026; H02J 1/08; H02M 1/32; H02M 2001/008; H04B 2203/547; H04B 3/548; H05B 2214/02; H05B 2214/04; H05B 3/06; H05B 3/262; H05B 3/28

See application file for complete search history.

(56) References Cited

U.S. PATENT DOCUMENTS

| | | | |
|---|---|---|---|
| 3,453,415 A | 7/1969 | Hermes | |
| 4,514,619 A * | 4/1985 | Kugelman | ............. B64D 15/14 |
| | | | 219/202 |
| 4,638,960 A * | 1/1987 | Straube | .................... G01K 7/20 |
| | | | 219/497 |
| 5,539,602 A | 7/1996 | Schmitz | |

(Continued)

FOREIGN PATENT DOCUMENTS

| | | |
|---|---|---|
| DE | 102007014335 | 10/2008 |
| JP | 2015094660 | 5/2015 |

OTHER PUBLICATIONS

EP Search report dated Aug. 18, 2017 in EP Application No. 17160738.5.

*Primary Examiner* — Vinh Nguyen

(74) *Attorney, Agent, or Firm* — Snell & Wilmer, L.L.P.

(57) ABSTRACT

Systems and methods for electronics systems are provided herein. An electronics system may comprise a heating circuit and a fault detection system. The heating circuit may include a heating element. The fault detection system may include a first resistor comprising a first resistance, a second resistor comprising a second resistance, the first resistance being equal to the second resistance, a voltage level detector, and a controllable switch connected in series with the first resistor and the second resistor, the controllable switch in electronic communication with the voltage level detector. A fault may be detected in response to the first voltage being greater than the second voltage.

20 Claims, 4 Drawing Sheets

(56) References Cited

U.S. PATENT DOCUMENTS

| | | |
|---|---|---|
| 8,921,739 B2 | 12/2014 | Petrenko |
| 2011/0149447 A1 | 6/2011 | Fink |
| 2014/0097177 A1 | 4/2014 | Rochell |

* cited by examiner

DC POWER HEATER SHORT-TO-CHASSIS GROUND DETECTION CIRCUIT

FIELD

The disclosure generally relates to electronics systems, and more particularly to the design of a fault detection system for electronics systems in aircraft.

BACKGROUND

Modern aircraft may utilize various electronics systems, such as ice detection systems, deicing systems, air data probes, etc. Various electronics systems may include a heating element. A voltage potential may be applied across the heating element to draw current through the heating element and convert electrical energy to thermal energy.

SUMMARY

An electronics system may comprise: a fault detection system and a heating circuit in electronic communication with the fault detection system. The fault detection system may include a first resistor comprising a first resistance, a second resistor comprising a second resistance, the first resistance being equal to the second resistance; a voltage level detector configured to receive a signal based on a first voltage across the first resistor and a second voltage across the second resistor, and a controllable switch connected in series with the first resistor and the second resistor, the controllable switch in electronic communication with the voltage level detector.

In various embodiments, the heating circuit may include a heating element in electronic communication with the first resistor and the second resistor, the heating element comprising a third resistance, the first resistor, the second resistor, the controllable switch, and the heating element being connected in series, the third resistance being greater than the first resistance, and the heating element being located downstream of the first resistor and upstream of the second resistor. The fault detection system may further comprise a differential amplifier, the differential amplifier configured to detect the first voltage across the first resistor and the second voltage across the second resistor and configured to calculate a voltage difference between the first voltage and the second voltage, wherein the difference between the first voltage and the second voltage may be based upon a difference between a first current and a second current. The voltage level detector may receive the voltage difference from the differential amplifier and determines if the voltage difference is greater than a threshold value. The controllable switch may be moved to an open position in response to the voltage difference being greater than the threshold value. The differential amplifier may comprise a first op-amp connected across the first resistor, a second op-amp connected across the second resistor, and a third op-amp connected to the first op-amp and the second op-amp. The voltage level detector may receive the voltage difference from the third op-amp. The fault detection system may further comprise an analog-to-digital converter (ADC) in electronic communication with the voltage level detector, the ADC configured to measure the first voltage and the second voltage and convert the first voltage and the second voltage from an analog to a digital signal. The voltage level detector may receive the digital signal from the ADC and calculates a voltage difference by subtracting the second voltage from the first voltage. The voltage level detector may determine whether the voltage difference is greater than a threshold value. The controllable switch may be moved to an open position in response to the voltage difference being greater than the threshold value. The controllable switch may be located upstream of the heating element and downstream of the first resistor. The controllable switch may be located downstream of the heating element and upstream of the second resistor. The fault detection system may be configured to send a fault signal in response to the voltage difference being greater than the threshold value.

An ice detection system may comprise: a first resistor comprising a first resistance, the first resistor configured to provide a means of measuring a first current; a second resistor in series with the first resistor, the second resistor comprising a second resistance and configured to provide a means of measuring a second current, wherein the second current is less than the first current in response to a fault in the ice detection system; a heating element comprising a third resistance; a controllable switch in electronic communication with the first resistor and in electronic communication with the heating element, the controllable switch located upstream of the heating element and downstream of the first resistor, wherein the first current is configured to flow from the first resistor, through the controllable switch, through the heating element, and through the second resistor; and a voltage level detector in electronic communication with the controllable switch.

In various embodiments, the ice detection system may further comprise a differential amplifier, the differential amplifier configured to measure a first voltage across the first resistor and a second voltage across the second resistor, and calculate a voltage difference between the first voltage and the second voltage. The voltage level detector may be in electronic communication with the differential amplifier and configured to receive the voltage difference from the differential amplifier and configured to determine if the voltage difference is greater than a threshold value. The controllable switch may be configured to move to an open position in response to the voltage difference being greater than the threshold value. The first current and the second current may comprise a direct current (DC). The first resistance may be equal to the second resistance and the third resistance may be greater than the first resistance.

A method of detecting a fault in a heating circuit may comprise: detecting a first voltage across a first resistor; detecting a second voltage across a second resistor, the second resistor being in series with the first resistor; calculating a voltage difference between the first voltage and the second voltage; determining if the voltage difference is greater than a predetermined threshold value; and sending a disable signal to a controllable switch in response to the voltage difference being greater than the predetermined threshold value, wherein the controllable switch moves to an open position in response to the sending.

In various embodiments, the calculating may be performed by connecting a first op-amp across the first resistor, connecting a second op-amp across the second resistor, and connecting a third op-amp to the first op-amp and the second op-amp.

The foregoing features, elements, steps, or methods may be combined in various combinations without exclusivity, unless expressly indicated herein otherwise. These features, elements, steps, or methods as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

Figure 1:
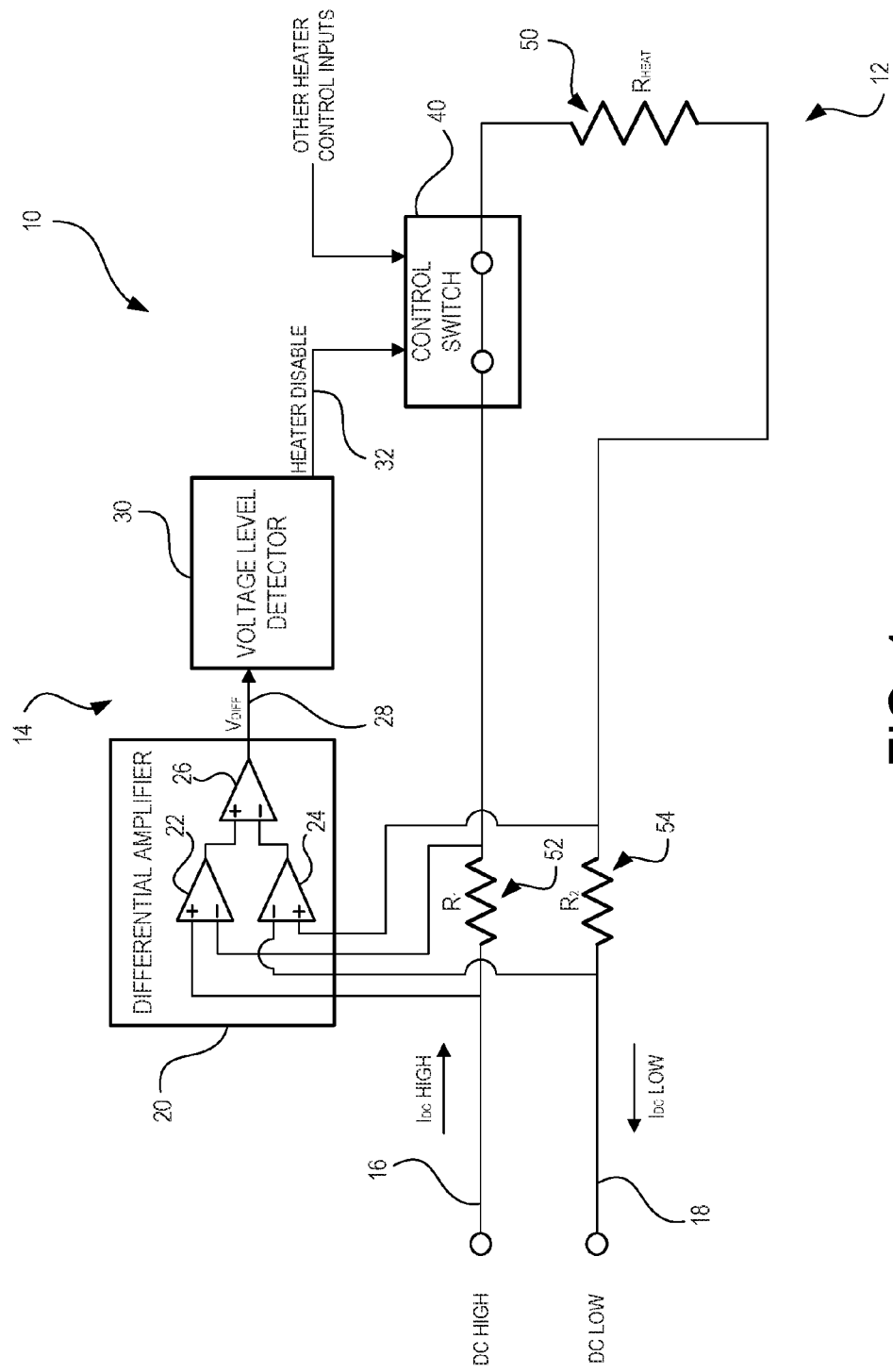
FIG. 1 illustrates a schematic view of an electronics system comprising a heating circuit and a fault detection system, in accordance with various embodiments.

The detailed description of various embodiments herein makes reference to the accompanying drawings, which show various embodiments by way of illustration. While these various embodiments are described in sufficient detail to enable those skilled in the art to practice the inventions, it should be understood that other embodiments may be realized and that logical, chemical and mechanical changes may be made without departing from the spirit and scope of the inventions. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

System program instructions and/or controller instructions may be loaded onto a non-transitory, tangible computer-readable medium having instructions stored thereon that, in response to execution by a controller, cause the controller to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in In Re Nuijten to fall outside the scope of patentable subject matter under 35 U.S.C. § 101.

As used herein, "electronic communication" means communication of electronic signals with physical coupling (e.g., "electrical communication" or "electrically coupled") or without physical coupling and via an electromagnetic field (e.g., "inductive communication" or "inductively coupled" or "inductive coupling").

Modern aircraft may utilize various electronics systems, such as ice detection systems, deicing systems, and air data probes, for example. Various electronics systems may include a heater circuit comprising a heating element. A voltage potential may be applied across the heating element to draw current through the heating element and convert electrical energy to thermal energy. Such heater circuits may fault (short circuit) to a chassis ground and fail. Typical heater circuits may not be able to detect this fault condition. Thus, an electronics system having a heater circuit with a ground fault detection system is provided herein, in accordance with various embodiments. The current going to the heater circuit is compared with the current going out the heater circuit. A fault is detected based upon the comparison.

With reference to FIG. 1, an electronics system 10 comprising a heating circuit 12 and a fault detection system 14 is illustrated, in accordance with various embodiments. As will become apparent, heating circuit 12 is in electronic communication with fault detection system 14. Heating circuit 12 may include heating element 50. Heating element 50 may comprise a resistive element, or a resistor. Heating element 50 may comprise a resistance $R_{HEAT}$ (also referred to herein as a third resistance). Electrical energy may be converted to thermal energy via heating element 50. Heating element 50 may receive current from a voltage source via wire 16. Such current may flow through wire 16, through heating element 50 and into wire 18. In various embodiments, such current may comprise a direct current (DC). Thus, the positive terminal of a voltage source may be in electronic communication with wire 16 (i.e., via terminal DC HIGH) and the negative terminal of the voltage source in electronic communication with wire 18 (i.e., via terminal DC LOW). In various embodiments, wire 16 and wire 18 may comprise a conductive metal, such as copper for example. In various embodiments, wire 16 and wire 18 may be protected via an insulator.

In various embodiments, fault detection system 14 may include a first resistor 52 and a second resistor 54. First resistor 52 may be connected in series with second resistor 54. First resistor 52 may be connected in series with heating element 50. First resistor 52 may comprise a resistance $R_1$ and second resistor 54 may comprise a second resistance $R_2$. In various embodiments, resistance $R_1$ and resistance $R_2$ may be equal. In various embodiments, resistance $R_{HEAT}$ may be greater than resistance $R_1$.

Figure 2:
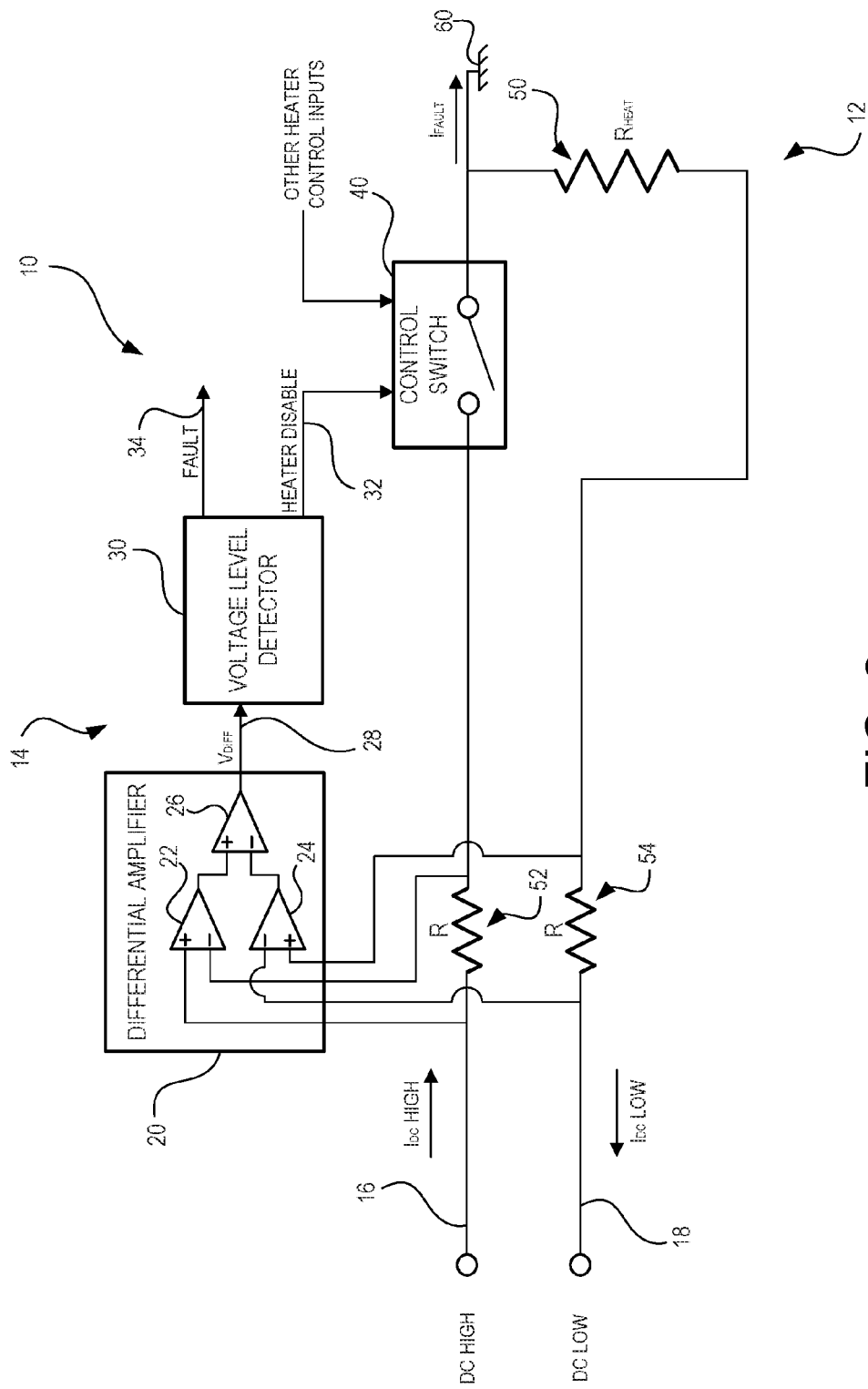
FIG. 2 illustrates a schematic view of an electronics system of FIG. 1 having a fault, in accordance with various embodiments.

In various embodiments, fault detection system 14 may include a controllable switch 40. Controllable switch 40 may be connected in series with first resistor 52 and heating element 50. Controllable switch 40 may receive inputs wherein controllable switch 40 moves from a closed position, as illustrated in FIG. 1, to an open position, as illustrated in FIG. 2, in response to the inputs. Controllable switch 40 may receive a signal (also referred to herein as a disable signal) 32 from voltage level detector 30. In this regard, controllable switch 40 may be in electronic communication with voltage level detector 30.

In various embodiments, fault detection system 14 may include voltage level detector 30. In various embodiments, voltage level detector 30 may comprise a controller. Voltage level detector 30 may receive a signal (also referred to herein as a voltage difference signal) 28. Voltage level detector 30 may determine if signal 28 is greater than a threshold value. The threshold value may be a predetermined threshold value. The threshold value may be determined such that noise in the current flowing through heating circuit 12 is not necessarily detected as a fault. For example, the threshold value may comprise between ten milliamps and two hundred milliamps (0.01-0.2 A). Voltage level detector 30 may send signal 32 to controllable switch 40 in response to signal 28 being greater than the threshold value.

In various embodiments, fault detection system 14 may include differential amplifier 20. Differential amplifier 20 may determine if a current (i.e., $I_{DC}$ HIGH) flowing through first resistor 52 is equal to a current flowing through second resistor 54 (i.e., $I_{DC}$ LOW). In this regard, differential amplifier 20 may determine a voltage difference between a voltage across first resistor 52 and a voltage across second resistor 54. In various embodiments, differential amplifier may include a first op-amp 22, a second op-amp 24, and a third op-amp 26. First op-amp 22 may be connected across first resistor 52. Second op-amp 24 may be connected across the second resistor 54. Third op-amp may be connected to first op-amp 22 and second op-amp 24. Accordingly, first op-amp 22 may measure a first voltage across first resistor 52, second op-amp 24 may measure a second voltage across second resistor 54, and third op-amp 26 may measure a voltage difference between the first voltage and the second voltage. Signal 28 may comprise or be based on the voltage difference and may be sent to voltage level detector 30. Signal 28 and/or the voltage difference may be based upon a difference between a first current (i.e., $I_{DC}$ HIGH) and a second current (i.e., $I_{DC}$ LOW). For example, signal 28 may be proportional to the voltage difference or otherwise comprise the voltage difference scaled by a constant value. In this manner, signal 28 may be based on said first voltage and said second voltage. In this regard, first resistor 52 and second resistor 54 may be configured to provide means of measuring current in heating circuit 12.

As illustrated in FIG. 1, current $I_{DC}$ HIGH (also referred to herein as a first current) may flow from terminal DC HIGH towards heating element 50 and current $I_{DC}$ LOW (also referred to herein as a second current) may flow from heating element 50 towards terminal DC LOW. Thus, the term "upstream" may refer to a first components relative location with a second component, the first and second components being coupled in series. Upstream may refer to the direction opposite current flow and downstream may refer to the direction of current flow. In this regard, first resistor 52 may be located upstream from controllable switch 40; controllable switch 40 may be located upstream from heating element 50 and downstream from first resistor 52; heating element 50 may be located downstream from controllable switch 40 and upstream from second resistor 54 and second resistor 54 may be located downstream from heating element 50. Although illustrated as being upstream of heating element 50, controllable switch 40 may be located downstream from heating element 50 and upstream from second resistor 54, in accordance with various embodiments. Generally, current flowing into heating circuit 12 (e.g., via terminal DC HIGH) is equal to current flowing out heating circuit 12 (e.g., via terminal DC LOW).

With reference to FIG. 2, the electronics system 10 of FIG. 1 is illustrated having a fault, in accordance with various embodiments. As previously mentioned, under various circumstances heating circuit 12 may contact a ground 60. Although, illustrated as being located between controllable switch 40 and heating element 50, the fault may be located in any location of electronics system 10. In various embodiments, ground 60 may comprise a chassis. In response to a conductive portion of heating circuit 12 (i.e., wire 16) contacting ground 60 a current (i.e., current $I_{FAULT}$) may flow from heating circuit 12 to ground 60. In this manner, a portion of current $I_{DC}$ HIGH may flow into ground 60 and thus current $I_{DC}$ HIGH will be greater than current $I_{DC}$ LOW. Furthermore, voltage level detector 30 may detect, via signal 28, that current $I_{DC}$ HIGH is greater than current $I_{DC}$ LOW and send signal 32 to controllable switch 40, wherein in response to signal 32 controllable switch moves to an open position as illustrated in FIG. 2. In response to controllable switch 40 moving to an open position, heating circuit 12 may comprise an open circuit and current would not flow through controllable switch 40. Stated another way, current $I_{FAULT}$ and current $I_{DC}$ LOW comprise a current of zero Amps in response to controllable switch 40 moving to an open position. In this regard, fault detection system 14 may prevent energy from heating circuit 12 from draining into ground 60. Similarly, fault detection system 14 may provide a means of detecting a fault and improve efficiency of heating circuit 12.

In various embodiments, in response to a fault being detected in heating circuit 12, a fault signal 34 may be sent from voltage level detector 30. Fault signal 34 may be sent to a controller in a vehicle such as an aircraft. Fault signal 34 may be used to indicate to an operator or an aircraft system that a fault has been detected in heating circuit 12. In various embodiments, fault signal 34 may comprise a Boolean data type.

Figure 4:
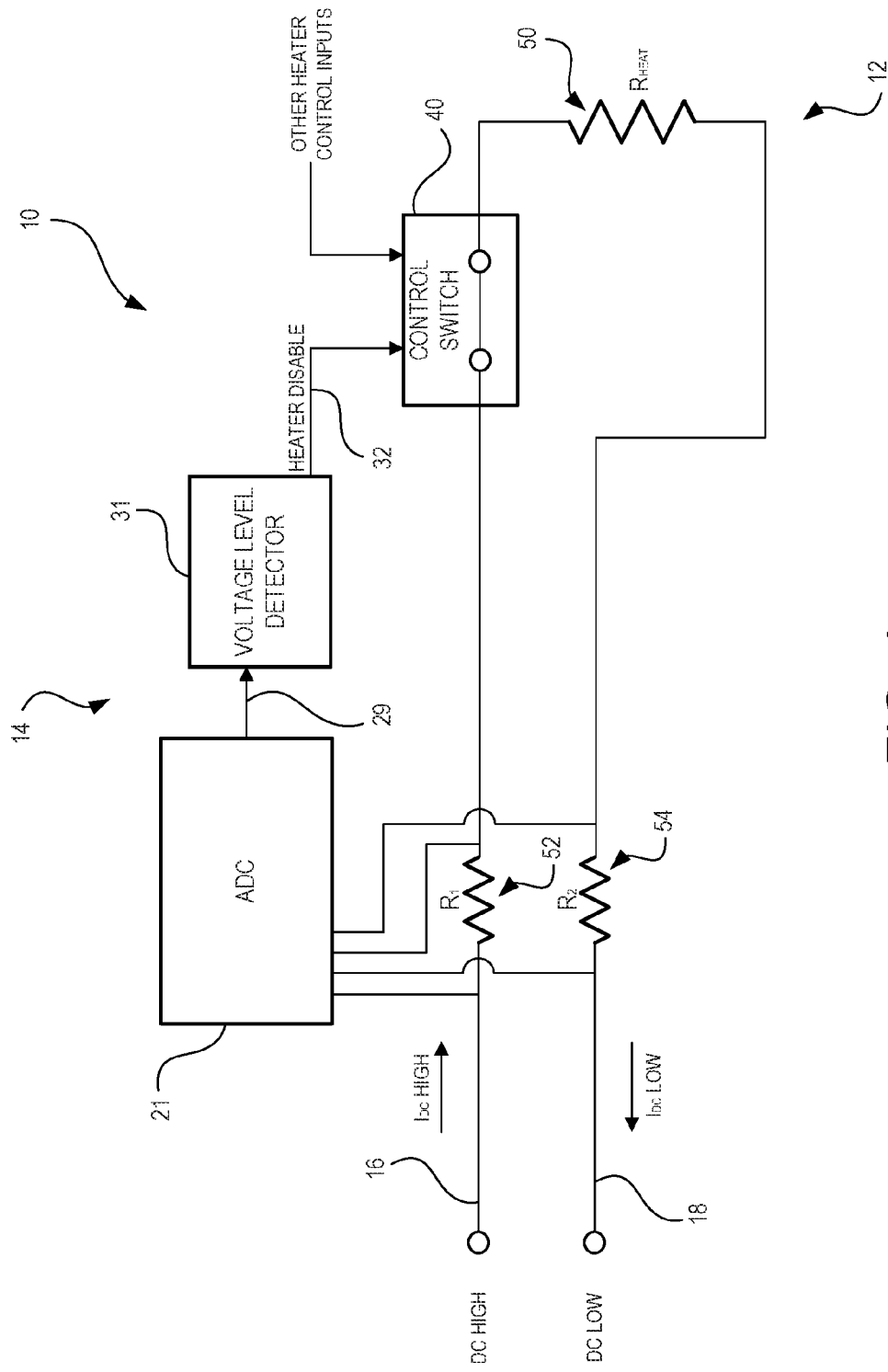
FIG. 4 illustrates a schematic view of an electronics system comprising a heating circuit and a fault detection system, the fault detection system comprising an analog-to-digital converter (ADC), in accordance with various embodiments.

With reference to FIG. 4, fault detection system 14 comprising an analog-to-digital converter (ADC) 21 is illustrated, in accordance with various embodiments. In various embodiments, ADC 21 may be similar to differential amplifier 20 (see FIG. 1). Fault detection 14 system may comprise voltage level detector 31. Voltage level detector 31 may be similar to voltage level detector 30 (see FIG. 1). ADC 21 may convert a first voltage across first resistor 52 and a second voltage across second resistor 54 from analog signals to digital signals. Signal 29 may comprise the digital signal based on said first voltage and said second voltage. ADC 21 may be in electronic communication with voltage level detector 31. Voltage level detector 31 may receive signal 29. Voltage level detector 31 may calculate a voltage difference between said first voltage and said second voltage and determine if the voltage difference is greater than a threshold value.

Figure 3:
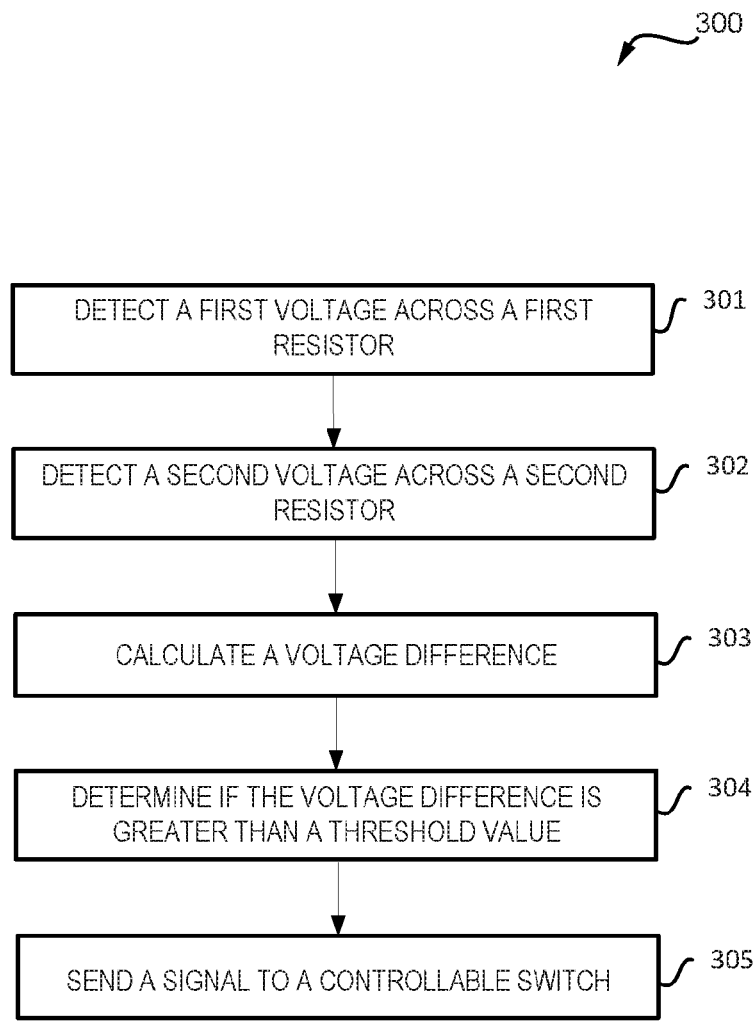
FIG. 3 illustrates method of detecting a fault in a heating circuit, in accordance with various embodiments.

With reference to FIG. 3, a method 300 of detecting a fault in a heating circuit is provided, in accordance with various embodiments. Method 300 may include detecting a first voltage across a first resistor in step 301. Method 300 may include detecting a second voltage across a second resistor in step 302. Method 300 may include calculating a voltage difference in step 303. Method 300 may include determining if the voltage difference is greater than a threshold value in step 304. Method 300 may include sending a signal to a controllable switch in step 305.

In various embodiments, with additional reference to FIG. 1, step 301 may include detecting a first voltage across first resistor 52. Step 302 may include detecting a second voltage across second resistor 54, second resistor 54 being in series with first resistor 52. The detecting may be performed by differential amplifier 20. Step 303 may include calculating a voltage difference (i.e., signal 28) between the first voltage and the second voltage. Step 304 may include determining if the voltage difference is greater than a predetermined threshold value. Step 305 may include sending a disable signal (i.e., signal 32) to a controllable switch in response to the voltage difference (i.e., signal 28) being greater than the predetermined threshold value, wherein controllable switch 40 moves to an open position in response to the sending. In various embodiments, the sending may be performed by voltage level detector 30. In various embodiments, the calculating may be performed by connecting first op-amp 22 across first resistor 52, connecting second op-amp 24 across second resistor 54, and connecting third op-amp 26 to first op-amp 22 and second op-amp 24.

Benefits, other advantages, and solutions to problems have been described herein with regard to specific embodiments. Furthermore, the connecting lines shown in the various figures contained herein are intended to represent various functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An electronics system comprising:
   a heating circuit; and
   a fault detection system in electronic communication with the heating circuit, the fault detection system including:
      a first resistor comprising a first resistance;
      a second resistor comprising a second resistance, the first resistance being equal to the second resistance;
      a voltage level detector configured to receive a signal based on a first voltage across the first resistor and a second voltage across the second resistor; and
      a controllable switch connected in series with the first resistor and the second resistor, the controllable switch in electronic communication with the voltage level detector,
   wherein the heating circuit is coupled in series between the first resistor and the second resistor.

2. The electronics system of claim 1, wherein the heating circuit includes a heating element in electronic communication with the first resistor and the second resistor;
   the heating element comprising a third resistances;
   the first resistor, the second resistor, the controllable switch, and the heating element being connected in series;
   the third resistance being greater than the first resistance; and
   the heating element being located downstream of the first resistor and upstream of the second resistor.

3. The electronics system of claim 2, wherein the fault detection system further comprises a differential amplifier, the differential amplifier configured to detect the first voltage across the first resistor and the second voltage across the second resistor and configured to calculate a voltage difference between the first voltage and the second voltage, wherein the difference between the first voltage and the second voltage is based upon a difference between a first current through the first resistor and a second current through the second resistor.

4. The electronics system of claim 3, wherein the voltage level detector receives the voltage difference from the differential amplifier and determines if the voltage difference is greater than a threshold value.

5. The electronics system of claim 4, wherein the controllable switch is moved to an open position in response to the voltage difference being greater than the threshold value.

6. The electronics system of claim 5, wherein the differential amplifier comprises a first op-amp connected across the first resistor, a second op-amp connected across the second resistor, and a third op-amp connected to the first op-amp and the second op-amp.

7. The electronics system of claim 5, wherein the fault detection system is configured to send a fault signal in response to the voltage difference being greater than the threshold value.

8. The electronics system of claim 6, wherein the voltage level detector receives the voltage difference from the third op-amp.

9. The electronics system of claim 2, wherein the fault detection system further comprises an analog-to-digital converter (ADC) in electronic communication with the voltage level detector, the ADC configured to measure the first voltage and the second voltage and convert the first voltage and the second voltage from an analog to a digital signal.

10. The electronics system of claim 9, wherein the voltage level detector receives the digital signal from the ADC and calculates a voltage difference by subtracting the second voltage from the first voltage, and wherein the voltage level detector determines whether the voltage difference is greater than a threshold value.

11. The electronics system of claim 10, wherein the controllable switch is moved to an open position in response to the voltage difference being greater than the threshold value.

12. The electronics system of claim 2, wherein the controllable switch is located at least one of:
    upstream of the heating element and downstream of the first resistor; and downstream of the heating element and upstream of the second resistor.

13. An ice detection system comprising:
a first resistor comprising a first resistance, the first resistor configured to provide a means of measuring a first current;
a second resistor in series with the first resistor, the second resistor comprising a second resistance and configured to provide a means of measuring a second current, wherein the second current is less than the first current in response to a fault in the ice detection system;
a heating element comprising a third resistance;
a controllable switch in electronic communication with the first resistor and in electronic communication with the heating element, the controllable switch located upstream of the heating element and downstream of the first resistor, wherein the first current is configured to flow from the first resistor, through the controllable switch, through the heating element, and through the second resistor; and
a voltage level detector in electronic communication with the controllable switch
wherein the heating element is coupled in series between the first resistor and the second resistor.

14. The ice detection system of claim 13, further comprising a differential amplifier, the differential amplifier configured to measure a first voltage across the first resistor and a second voltage across the second resistor, and calculate a voltage difference between the first voltage and the second voltage.

15. The ice detection system of claim 14, wherein the voltage level detector is in electronic communication with the differential amplifier and configured to receive the voltage difference from the differential amplifier and configured to determine if the voltage difference is greater than a threshold value.

16. The ice detection system of claim 15, wherein the controllable switch is configured to move to an open position in response to the voltage difference being greater than the threshold value.

17. The ice detection system of claim 16, wherein the first current and the second current comprise a direct current (DC).

18. The ice detection system of claim 13, wherein the first resistance is equal to the second resistance and the third resistance is greater than the first resistance.

19. A method of detecting a fault in a heating circuit, comprising:
detecting a first voltage across a first resistor;
detecting a second voltage across a second resistor, the second resistor being in series with the first resistor;
calculating a voltage difference between the first voltage and the second voltage;
determining if the voltage difference is greater than a predetermined threshold value;
detecting the fault in response to the voltage difference being greater than the predetermined threshold value; and
sending a disable signal to a controllable switch in response to the voltage difference being greater than the predetermined threshold value, wherein the controllable switch moves to an open position in response to the sending.

20. The method of claim 19, wherein the calculating is performed by connecting a first op-amp across the first resistor, connecting a second op-amp across the second resistor, and connecting a third op-amp to the first op-amp and the second op-amp.

* * * * *